(12) United States Patent
Yoon et al.

(10) Patent No.: US 11,923,317 B2
(45) Date of Patent: Mar. 5, 2024

(54) SEMICONDUCTOR DEVICES

(71) Applicant: SAMSUNG ELECTRONICS CO., LTD., Suwon-si (KR)

(72) Inventors: Changjoon Yoon, Seoul (KR); Sunme Lim, Yongin-si (KR); Kyeong-Yeol Kwak, Gunpo-si (KR); Soojung Kim, Ansan-si (KR)

(73) Assignee: Samsung Electronics Co., Ltd. (KR)

( * ) Notice: Subject to any disclaimer, the term of this patent is extended or adjusted under 35 U.S.C. 154(b) by 338 days.

(21) Appl. No.: 17/230,416

(22) Filed: Apr. 14, 2021

(65) Prior Publication Data

US 2022/0077073 A1 Mar. 10, 2022

(30) Foreign Application Priority Data

Sep. 8, 2020 (KR) .................. 10-2020-0114608

(51) Int. Cl.
*H01L 21/66* (2006.01)
*G03F 7/00* (2006.01)
*H01L 23/528* (2006.01)
*H01L 23/544* (2006.01)

(52) U.S. Cl.
CPC ........ *H01L 23/544* (2013.01); *G03F 7/70483* (2013.01); *H01L 22/32* (2013.01); *H01L 23/528* (2013.01)

(58) Field of Classification Search
CPC ......... H01L 22/14; H01L 22/34; H01L 22/32; H01L 2223/54426; H01L 2223/5446; H01L 2223/5442; H01L 23/544; H01L 23/528; G03F 7/70683
See application file for complete search history.

(56) References Cited

U.S. PATENT DOCUMENTS

| 5,053,850 | A | * | 10/1991 | Baker | ............... | H01L 22/32 |
|  |  |  |  |  |  | 257/786 |
| 6,555,922 | B1 | * | 4/2003 | Nakagawa | ........... | H01L 22/32 |
|  |  |  |  |  |  | 257/E23.179 |
| 6,628,001 | B1 | * | 9/2003 | Chittipeddi | ......... | H01L 23/544 |
|  |  |  |  |  |  | 257/E23.179 |
| 9,935,056 | B2 | * | 4/2018 | Kim | .................. | H01L 21/4853 |
| 10,274,537 | B2 | * | 4/2019 | Yeh | ..................... | H01J 37/28 |

(Continued)

FOREIGN PATENT DOCUMENTS

| JP | 4777504 B2 | 9/2011 |
| KR | 20080049372 A | 6/2008 |

(Continued)

*Primary Examiner* — Mounir S Amer
*Assistant Examiner* — Alexander Belousov
(74) *Attorney, Agent, or Firm* — Myers Bigel, P.A.

(57) ABSTRACT

Disclosed is a semiconductor device comprising a substrate, a first lower pattern group on the substrate and including a first key pattern and first lower test patterns horizontally spaced apart from the first key pattern, and a first upper pattern group on the first lower pattern group and including first pads horizontally spaced apart from each other and first upper test patterns between adjacent ones of the first pads. The first key pattern is configured to be used for a photography process associated with fabrication of the semiconductor device. The first pads are electrically connected to the first upper test patterns. One of the first pads vertically overlaps with the first key pattern.

20 Claims, 8 Drawing Sheets

(56) References Cited

U.S. PATENT DOCUMENTS

| | | | |
|---|---|---|---|
| 10,535,573 B2* | 1/2020 | Wann | H01L 22/32 |
| 10,566,290 B2* | 2/2020 | Sun | G01B 21/24 |
| 10,567,688 B2* | 2/2020 | Lee | H04N 25/702 |
| 2002/0149120 A1* | 10/2002 | Sugiyama | H01L 22/34 257/621 |
| 2005/0139964 A1* | 6/2005 | Ando | H01L 22/34 257/620 |
| 2017/0148742 A1* | 5/2017 | Kim | H01L 24/16 |
| 2019/0137808 A1* | 5/2019 | Koide | G02F 1/13452 |
| 2019/0221535 A1* | 7/2019 | Shin | H01L 22/34 |
| 2021/0082809 A1* | 3/2021 | Kim | H01L 23/528 |
| 2021/0175133 A1* | 6/2021 | Choi | H01L 23/544 |
| 2021/0231727 A1* | 7/2021 | Park | G01R 31/2621 |
| 2022/0077073 A1* | 3/2022 | Yoon | H01L 23/544 |
| 2023/0067386 A1* | 3/2023 | Choi | H01L 23/528 |

FOREIGN PATENT DOCUMENTS

| | | |
|---|---|---|
| KR | 100983591 | 9/2010 |
| KR | 101766221 B1 | 8/2017 |
| KR | 102124827 B1 | 6/2020 |

\* cited by examiner

SEMICONDUCTOR DEVICES

CROSS-REFERENCE TO RELATED APPLICATION

This U.S. nonprovisional application claims priority under 35 U.S.C § 119 to Korean Patent Application No. 10-2020-0114608 filed on Sep. 8, 2020, in the Korean Intellectual Property Office, the disclosure of which is hereby incorporated by reference in its entirety.

BACKGROUND

The present inventive concepts relate to semiconductor devices, and more particularly, to semiconductor devices including a test element group (TEG) that evaluates characteristics of a semiconductor element included in an integrated circuit.

Semiconductor elements (e.g., transistor, capacitor, resistor, and/or inductor) included in semiconductor integrated circuits may be formed by performing a series of unit processes including a deposition process to deposit a thin layer on a semiconductor substrate and photography/etching processes to pattern the thin layer. To ascertain the coincidence of the semiconductor elements with designs of the semiconductor integrated circuits, whenever each unit process is completed, it may be possible to inspect whether or not the semiconductor elements have defects and to evaluate parameter characteristics of the semiconductor elements. The semiconductor elements may be formed together with measuring elements and/or test elements for evaluation of characteristics of the semiconductor elements. The semiconductor substrate may include chip regions on which the integrated circuits are formed and a scribe line between the chip regions, and generally the test elements may be formed on the scribe line of the semiconductor substrate.

SUMMARY

Some example embodiments of the present inventive concepts provide a semiconductor device capable of increasing the use of a space of the scribe line and of increasing the number of chip regions in a semiconductor substrate.

Some example embodiments of the present inventive concepts provide a semiconductor device capable of increasing a process margin of photolithography.

According to some example embodiments of the present inventive concepts, a semiconductor device may comprise: a substrate; a first lower pattern group on the substrate, wherein the first lower pattern group may include a first key pattern, and a plurality of first lower test patterns that are horizontally spaced apart from the first key pattern; and a first upper pattern group on the first lower pattern group, wherein the first upper pattern group may include a plurality of first pads that are horizontally spaced apart from each other, and a plurality of first upper test patterns between adjacent ones of the plurality of first pads. The first key pattern may be configured to be used for a photography process associated with fabrication of the semiconductor device. The plurality of first pads may be electrically connected to the plurality of first upper test patterns. One of the plurality of first pads may vertically overlap with the first key pattern.

According to some example embodiments of the present inventive concepts, a semiconductor device may comprise: a substrate that includes a plurality of chip regions and a scribe line between the plurality of chip regions; a plurality of key patterns on the scribe line; and a test element group (TEG) on the scribe line. The test element group may include a plurality of pads that are spaced apart from each other in a first direction parallel to a top surface of the substrate. The plurality of key patterns may be between the substrate and the plurality of pads. Each of the plurality of key patterns may vertically overlap in a second direction with a corresponding one of the plurality of pads. The second direction may be perpendicular to the top surface of the substrate. The plurality of key patterns may be at different levels in the second direction from the top surface of the substrate.

According to some example embodiments of the present inventive concepts, a semiconductor device, includes: a substrate including a plurality of chip regions and a scribe line between the plurality of chip regions; a lower pattern group on the scribe line, wherein the lower pattern group comprises a photolithography key pattern and a plurality of lower test patterns that are horizontally spaced apart from the photolithography key pattern; and an upper pattern group on the lower pattern group, wherein the upper pattern group comprises a first pad and a plurality of upper test patterns that are horizontally spaced apart from the first pad. The first pad may be electrically connected to the plurality of upper test patterns and the plurality of lower test patterns, and the first pad may vertically overlap the photolithography key pattern.

DETAILED DESCRIPTION

Some example embodiments of the present inventive concepts will be described below in detail in conjunction with the accompanying drawings to aid in clearly understanding the present inventive concepts.

Figure 1:
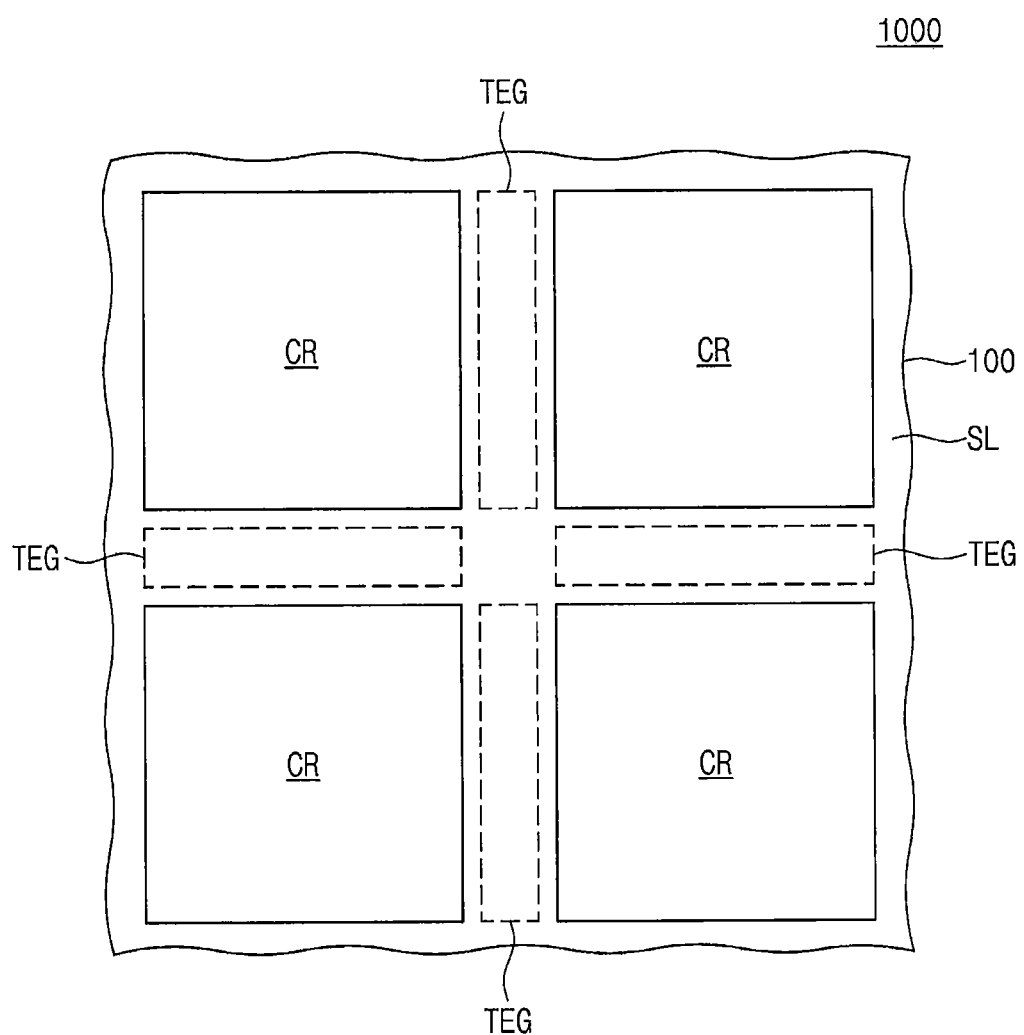
FIG. 1 illustrates a plan view showing a semiconductor device according to some example embodiments of the present inventive concepts.

FIG. 1 illustrates a plan view showing a semiconductor device 1000 according to some example embodiments of the present inventive concepts.

Referring to FIG. 1, a semiconductor device 1000 may include a substrate 100, which substrate 100 may include a plurality of chip regions CR and a scribe line SL between the plurality of chip regions CR. The substrate 100 may be a semiconductor substrate, for example, a silicon substrate or a silicon-on-insulator (SOI) substrate. The plurality of chip regions CR may be provided thereon with semiconductor elements (e.g., transistor, capacitor, resistor, and/or inductor) that constitute an integrated circuit, and the scribe line SL may be provided thereon with a test element group TEG that evaluates characteristics of the semiconductor elements. As used herein, the term "and/or" includes any and all combinations of one or more of the associated listed items. Expressions such as "at least one of," when preceding a list of elements, modify the entire list of elements and do not modify the individual elements of the list.

Figure 2:
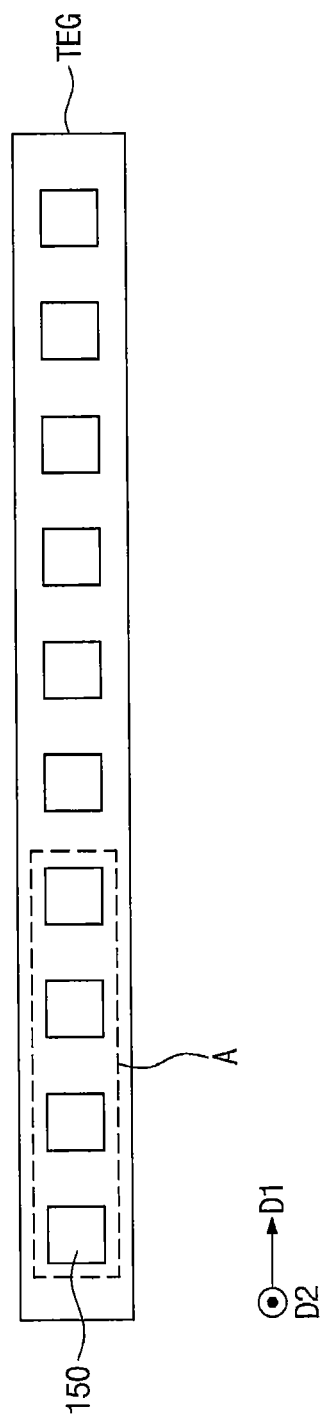
FIG. 2 illustrates a plan view partially showing a test element group of FIG. 1.
Figure 3:
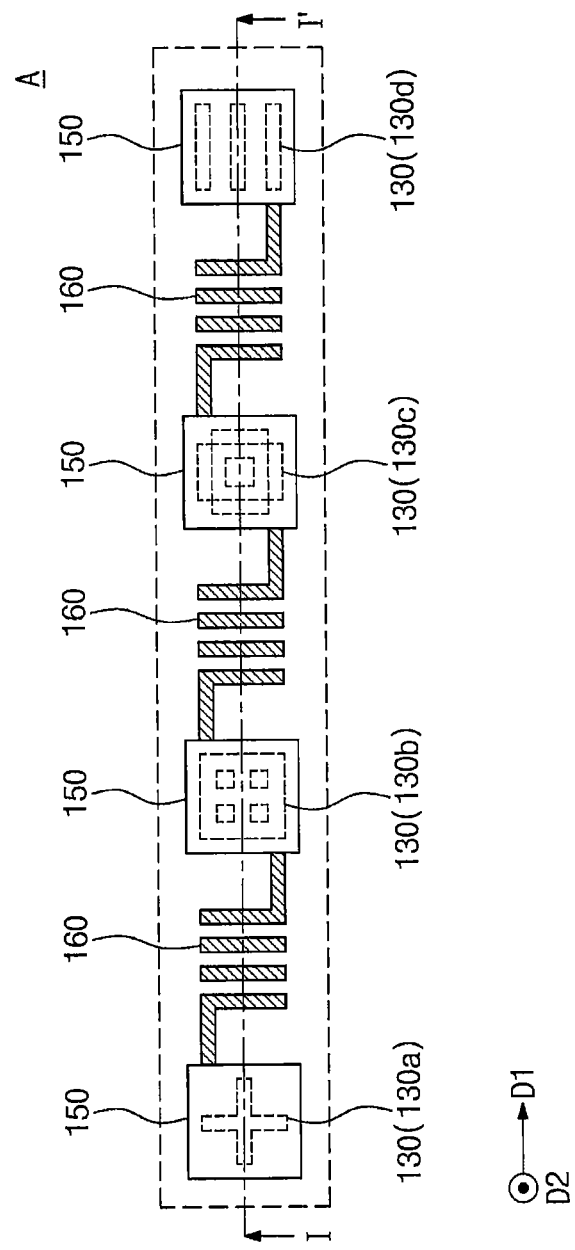
FIG. 3 illustrates an enlarged view showing section A of FIG. 2.
Figure 4:
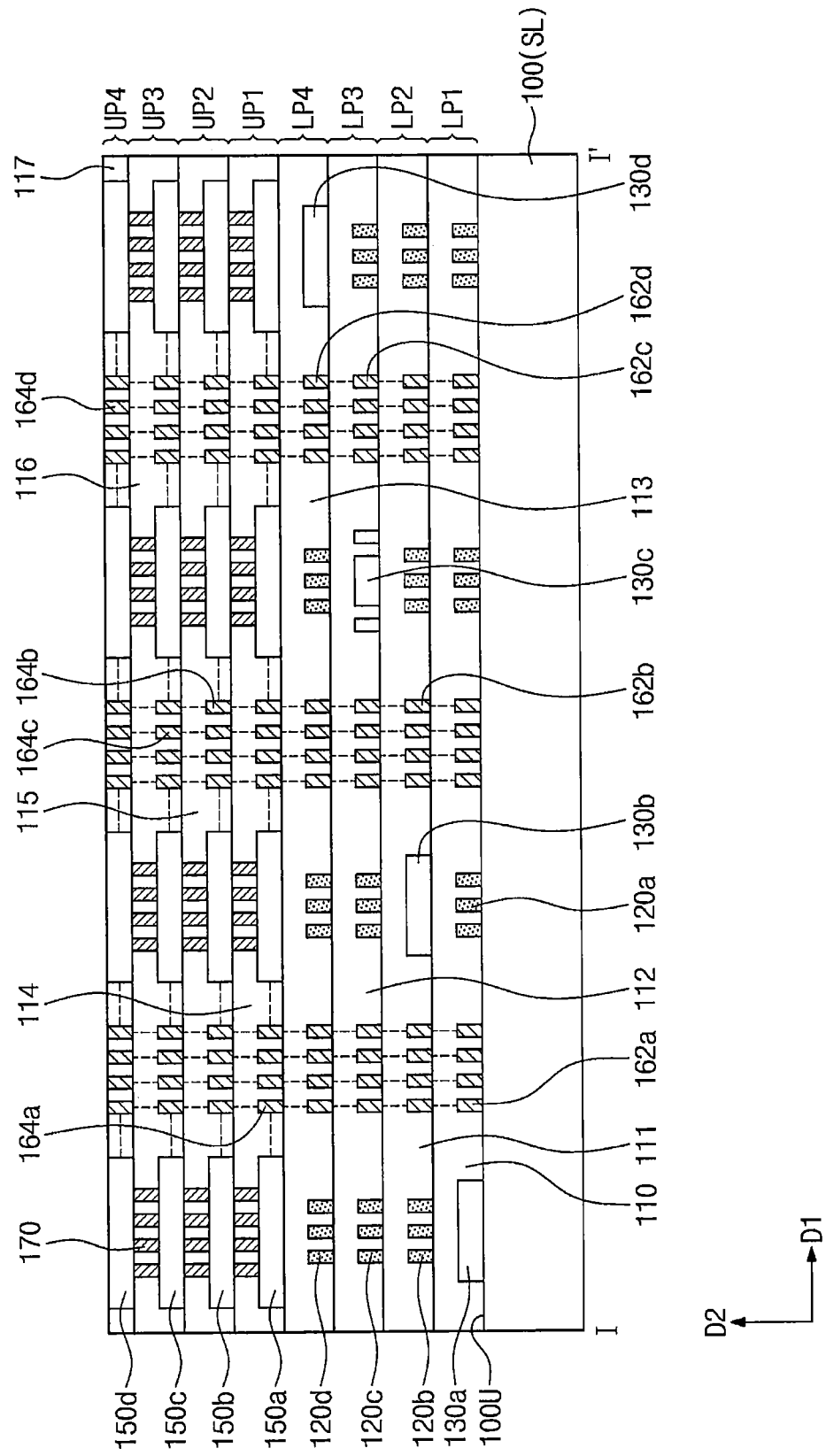
FIG. 4 illustrates a cross-sectional view taken along line I-I' of FIG. 3.
Figure 5:
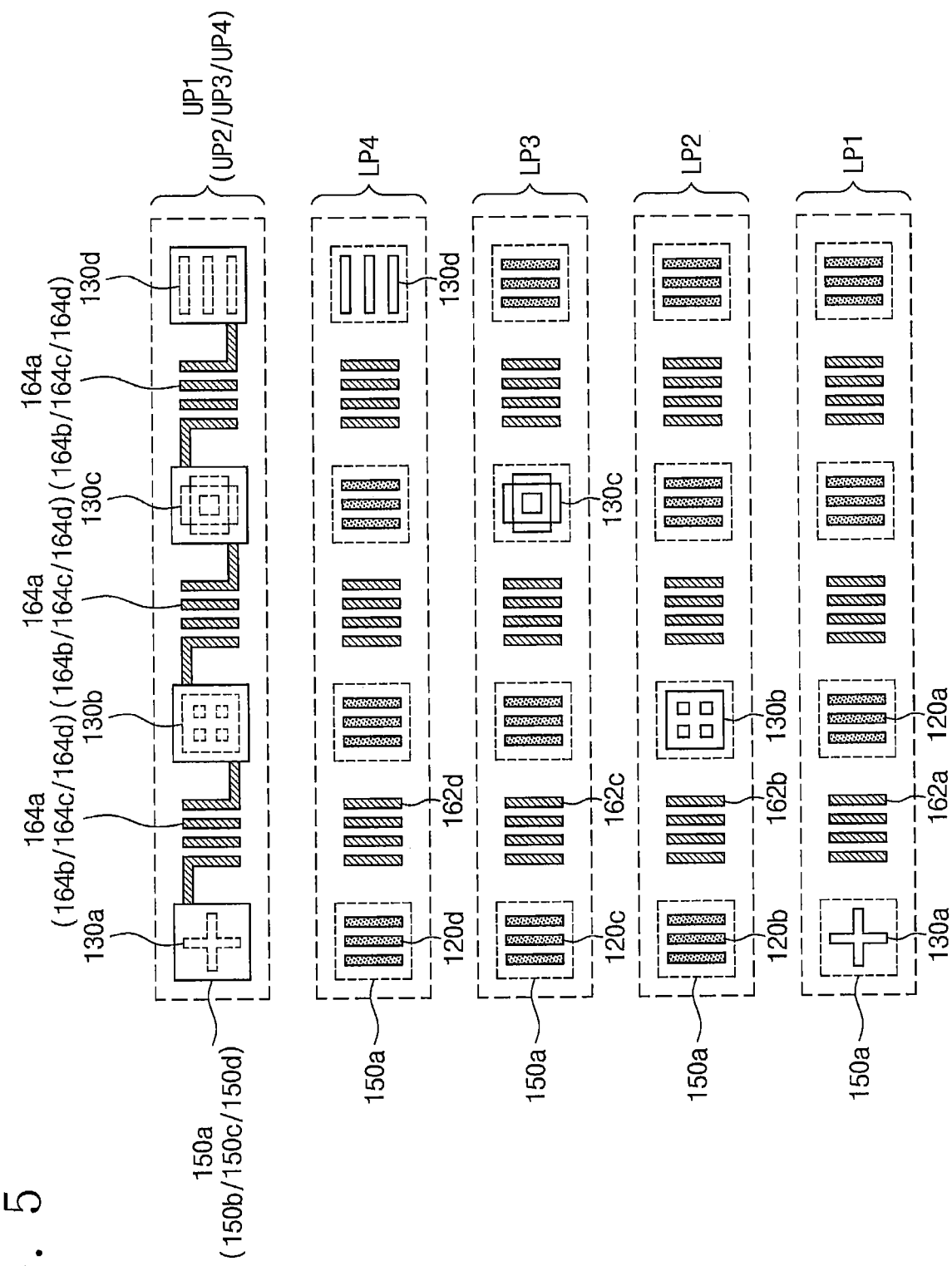
FIG. 5 illustrates a simplified conceptual diagram showing a planar arrangement of patterns in each pattern group of FIG. 4.

FIG. 2 illustrates a plan view partially showing the test element group TEG of FIG. 1. FIG. 3 illustrates an enlarged view showing section A of FIG. 2. FIG. 4 illustrates a cross-sectional view taken along line I-I' of FIG. 3. FIG. 5 illustrates a simplified conceptual diagram showing a planar arrangement of patterns in each pattern group of FIG. 4.

Referring to FIGS. 2 and 3, the test element group TEG may include a plurality of test patterns 160 and a plurality of pads 150 electrically connected to the test patterns 160. The plurality of pads 150 may be horizontally spaced apart from each other in a first direction D1, and the test patterns 160 may be disposed between the plurality of pads 150. The test patterns 160 may constitute test elements that evaluate characteristics of the semiconductor elements (e.g., transistor, capacitor, resistor, and/or inductor). The plurality of pads 150 may be used to communicate electrical signals with the test elements.

A plurality of key patterns 130 may be disposed in the test element group TEG on the scribe line SL. Each of the plurality of key patterns 130 may be an alignment key or an overlay key used for photolithography (e.g., a photolithography and/or photography process associated with the fabrication of the semiconductor device 1000). For example, one or more of the plurality of key patterns 130 may be used to assist in the alignment and/or positioning of photolithography elements, such as masks, though the present inventive concepts are not limited thereto. FIG. 3 depicts by way of example a planar shape of each of the plurality of key patterns 130, but the plurality of key patterns 130 may have various planar shapes different than those shown in FIG. 3. For example, FIG. 3 illustrates a first key pattern 130a, a second key pattern 130b, a third key pattern 130c, and a fourth key pattern 130d (collectively referred to as key patterns 130), each having a different shape in plan view. The first, second, third, and fourth key patterns 130a, 130b, 130c, 130d are merely examples and are not intended to limit the embodiments. The plurality of key patterns 130 may be disposed below the plurality of pads 150, and may be horizontally spaced apart from each other in the first direction D1. The plurality of key patterns 130 may be disposed between the substrate 100 and the plurality of pads 150. Each of the plurality of key patterns 130 may vertically overlap a corresponding one of the plurality of pads 150. It will be understood that "an element A vertically overlaps an element B" (or similar language) as used herein means that at least one vertical line intersecting both the elements A and B exists, but does not imply that all portions of A and/or B vertically overlap. It will be understood that, although the terms first, second, third, etc. may be used herein to describe various elements, the elements should not be limited by these terms; rather, these terms are only used to distinguish one element from another element. Thus, a first element discussed could be termed a second element without departing from the scope of the present inventive concepts.

Referring to FIGS. 3 to 5, the test element group TEG may include a first lower pattern group LP1, a second lower pattern group LP2, a third lower pattern group LP3, a fourth lower pattern group LP4, a first upper pattern group UP1, a second upper pattern group UP2, a third upper pattern group UP3, and a fourth upper pattern group UP4 that are sequentially stacked on the scribe line SL of the substrate 100. The substrate 100 may be provided thereon with the first, second, third, and fourth lower pattern groups LP1, LP2, L3, and LP4 and the first, second, third, and fourth upper pattern groups UP1, UP2, UP3, and UP4 that are stacked along a second direction D2 perpendicular to a top surface 100U of the substrate 100.

The first lower pattern group LP1 may include a first key pattern 130a among the plurality of key patterns 130. The first lower pattern group LP1 may include first lower test patterns 162a that are horizontally spaced apart from the first key pattern 130a in a direction (e.g., the first direction D1) parallel to the top surface 100U of the substrate 100. According to some example embodiments, the first lower pattern group LP1 may further include first dummy patterns 120a that are horizontally spaced apart from the first key pattern 130a and the first lower test patterns 162a in a direction (e.g., the first direction D1) parallel to the top surface 100U of the substrate 100. The first dummy patterns 120a may be electrically insulated from the first lower test patterns 162a. The first lower pattern group LP1 may further include a first lower interlayer dielectric layer 110 that is on and/or covers the first key pattern 130a, the first lower test patterns 162a, and the first dummy patterns 120a.

The second lower pattern group LP2 may include a second key pattern 130b among the plurality of key patterns 130. The second key pattern 130b may be located at a higher level than that of the first key pattern 130a, which level is measured from the top surface 100U of the substrate 100. In this description, the term "level" may be a distance measured in the second direction D2 from the top surface 100U of the substrate 100. When viewed in plan, the second key pattern 130b may be spaced apart in the first direction D1 from the first key pattern 130a. According to some example embodiments, the second key pattern 130b may vertically overlap in the second direction D2 with one or more of the first dummy patterns 120a.

The second lower pattern group LP2 may include second lower test patterns 162b that are horizontally spaced apart from the second key pattern 130b in a direction (e.g., the first direction D1) parallel to the top surface 100U of the substrate 100. The second lower test patterns 162b may be electrically connected to the first lower test patterns 162a (shown by dashed lines in FIG. 4).

The second lower pattern group LP2 may further include second dummy patterns 120b that are horizontally spaced apart from the second key pattern 130b and the second lower test patterns 162b in a direction (e.g., the first direction D1) parallel to the top surface 100U of the substrate 100. The second dummy patterns 120b may be electrically insulated from the second lower test patterns 162b. At least one of the second dummy patterns 120b may vertically overlap in the second direction D2 with the first key pattern 130a.

The second lower pattern group LP2 may further include a second lower interlayer dielectric layer 111 that is on and/or covers the second key pattern 130b, the second lower test patterns 162b, and the second dummy patterns 120b.

The third lower pattern group LP3 may include a third key pattern 130c among the plurality of key patterns 130. The third key pattern 130c may be located at a higher level than those of the first and second key patterns 130a and 130b, which level is measured from the top surface 100U of the substrate 100. When viewed in plan, the third key pattern 130c may be spaced apart in the first direction D1 from the first and second key patterns 130a and 130b. According to some example embodiments, the third key pattern 130c may vertically overlap in the second direction D2 with one or more of the first dummy patterns 120a and of the second dummy patterns 120b.

The third lower pattern group LP3 may include third lower test patterns 162c that are horizontally spaced apart from the third key pattern 130c in a direction (e.g., the first direction D1) parallel to the top surface 100U of the substrate 100. The third lower test patterns 162c may be electrically connected to the first and second lower test patterns 162a and 162b.

The third lower pattern group LP3 may further include third dummy patterns 120c that are horizontally spaced apart from the third key pattern 130c and the third lower test patterns 162c in a direction (e.g., the first direction D1) parallel to the top surface 100U of the substrate 100. The third dummy patterns 120c may be electrically insulated from the third lower test patterns 162c. One or more of the third dummy patterns 120c may vertically overlap in the second direction D2 with the first key pattern 130a, and another one or more of the third dummy patterns 120c may vertically overlap in the second direction D2 with the second key pattern 130b.

The third lower pattern group LP3 may further include a third lower interlayer dielectric layer 112 that covers the third key pattern 130c, the third lower test patterns 162c, and the third dummy patterns 120c.

The fourth lower pattern group LP4 may include a fourth key pattern 130d among the plurality of key patterns 130. The fourth key pattern 130d may be located at a higher level than those of the first, second, and third key patterns 130a, 130b, and 130c, which level is measured from the top surface 100U of the substrate 100. When viewed in plan, the fourth key pattern 130d may be spaced apart in the first direction D1 from the first, second, and third key patterns 130a, 130b, and 130c. According to some example embodiments, the fourth key pattern 130d may vertically overlap in the second direction D2 with one or more of the first dummy patterns 120a, of the second dummy patterns 120b, and of the third dummy patterns 120c.

The fourth lower pattern group LP4 may include fourth lower test patterns 162d that are horizontally spaced apart from the fourth key pattern 130d in a direction (e.g., the first direction D1) parallel to the top surface 100U of the substrate 100. The fourth lower test patterns 162d may be electrically connected to the first, second, and third lower test patterns 162a, 162b, and 162c.

The fourth lower pattern group LP4 may further include fourth dummy patterns 120d that are horizontally spaced apart from the fourth key pattern 130d and the fourth lower test patterns 162d in a direction (e.g., the first direction D1) parallel to the top surface 100U of the substrate 100. The fourth dummy patterns 120d may be electrically insulated from the fourth lower test patterns 162d. One or more of the fourth dummy patterns 120d may vertically overlap in the second direction D2 with the first key pattern 130a, and another one or more of the fourth dummy patterns 120d may vertically overlap in the second direction D2 with the second key pattern 130b. Still another one or more of the fourth dummy patterns 120d may vertically overlap in the second direction D2 with the third key pattern 130c.

The fourth lower pattern group LP4 may further include a fourth lower interlayer dielectric layer 113 that is on and/or covers the fourth key pattern 130d, the fourth lower test patterns 162d, and the fourth dummy patterns 120d.

The plurality of key patterns 130 may include the first, second, third, and fourth key patterns 130a, 130b, 130c, and 130d. The plurality of key patterns 130, such as the first, second, third, and fourth key patterns 130a, 130b, 130c, and 130d, may be located at different levels from each other from the top surface 100U of the substrate 100. The test patterns 160 may include first, second, third, and fourth lower test patterns 162a, 162b, 162c, and 162d.

The first upper pattern group UP1 may include a plurality of first pads 150a that are horizontally spaced apart from each other in a direction (e.g., the first direction D1) parallel to the top surface 100U of the substrate 100, and may also include a plurality of first upper test patterns 164a between the plurality of first pads 150a. The first upper test patterns 164a may be electrically connected to the first, second, third, and fourth lower test patterns 162a, 162b, 162c, and 162d. The plurality of first pads 150a may be electrically connected to the first upper test patterns 164a (e.g., shown by the dashed lines in FIG. 4).

The first, second, third, and fourth key patterns 130a, 130b, 130c, and 130d may be disposed below the plurality of first pads 150a and between the substrate 100 and the plurality of first pads 150a. Each of the first, second, third, and fourth key patterns 130a, 130b, 130c, and 130d, may vertically overlap in the second direction D2 with a corresponding one of the plurality of first pads 150a. For example, the first, second, third, and fourth key patterns 130a, 130b, 130c, and 130d may correspondingly vertically overlap in the second direction D2 with the plurality of first pads 150a. One or more of the second dummy patterns 120b, of the third dummy patterns 120c, and of the fourth dummy patterns 120d may be disposed between the first key pattern 130a and a corresponding first pad 150a, and another one or more of the third dummy patterns 120c and of the fourth dummy patterns 120d may be disposed between the second key pattern 130b and a corresponding first pad 150a. Still another one or more of the fourth dummy patterns 120d may be disposed between the third key pattern 130c and a corresponding first pad 150a.

The first upper pattern group UP1 may further include a first upper interlayer dielectric layer 114 that is on and/or covers the plurality of first pads 150a and the plurality of first upper test patterns 164a.

The second upper pattern group UP2 may include a plurality of second pads 150b that are horizontally spaced apart from each other in a direction (e.g., the first direction D1) parallel to the top surface 100U of the substrate 100, and may also include a plurality of second upper test patterns 164b between the plurality of second pads 150b. The second upper test patterns 164b may be electrically connected to the first upper test patterns 164a. The plurality of second pads 150b may be electrically connected to the second upper test patterns 164b.

Vias 170 may be interposed between the plurality of first pads 150a and the plurality of second pads 150b. The vias 170 may penetrate the first upper interlayer dielectric layer 114 and may electrically connect the plurality of first pads 150a to the plurality of second pads 150b. The plurality of second pads 150b may be correspondingly connected through the vias 170 to the plurality of first pads 150a. The plurality of second pads 150b may correspondingly vertically overlap the plurality of first pads 150a.

Each of the first, second, third, and fourth key patterns 130a, 130b, 130c, and 130d may vertically overlap in the second direction D2 with a corresponding one of the plurality of second pads 150b. For example, the first, second, third, and fourth key patterns 130a, 130b, 130c, and 130d may correspondingly vertically overlap in the second direction D2 with the plurality of second pads 150b. The second upper pattern group UP2 may further include a second upper interlayer dielectric layer 115 that is on and/or covers the plurality of second pads 150b and the plurality of second upper test patterns 164b.

The third upper pattern group UP3 may include a plurality of third pads 150c that are horizontally spaced apart from each other in a direction (e.g., the first direction D1) parallel to the top surface 100U of the substrate 100, and may also include a plurality of third upper test patterns 164c between the plurality of third pads 150c. The third upper test patterns 164c may be electrically connected to the second upper test patterns 164b. The plurality of third pads 150c may be electrically connected to the third upper test patterns 164c.

Vias 170 may be interposed between the plurality of second pads 150b and the plurality of third pads 150c. The vias 170 may penetrate the second upper interlayer dielectric layer 115 and may electrically connect the plurality of second pads 150b to the plurality of third pads 150c. The plurality of third pads 150c may be correspondingly connected through the vias 170 to the plurality of second pads 150b. The plurality of third pads 150c may correspondingly vertically overlap the plurality of second pads 150b.

Each of the first, second, third, and fourth key patterns 130a, 130b, 130c, and 130d may vertically overlap in the second direction D2 with a corresponding one of the plurality of third pads 150c. For example, the first, second, third, and fourth key patterns 130a, 130b, 130c, and 130d may correspondingly vertically overlap in the second direction D2 with the plurality of third pads 150c. The third upper pattern group UP3 may further include a third upper interlayer dielectric layer 116 that is on and/or covers the plurality of third pads 150c and the plurality of third upper test patterns 164c.

The fourth upper pattern group UP4 may include a plurality of fourth pads 150d that are horizontally spaced apart from each other in a direction (e.g., the first direction D1) parallel to the top surface 100U of the substrate 100, and may also include a plurality of fourth upper test patterns 164d between the plurality of fourth pads 150d. The fourth upper test patterns 164d may be electrically connected to the third upper test patterns 164c. The plurality of fourth pads 150d may be electrically connected to the fourth upper test patterns 164d.

Vias 170 may be interposed between the plurality of third pads 150c and the plurality of fourth pads 150d. The vias 170 may penetrate the third upper interlayer dielectric layer 116 and may electrically connect the plurality of third pads 150c to the plurality of fourth pads 150d. The plurality of fourth pads 150d may be correspondingly connected through the vias 170 to the plurality of third pads 150c. The plurality of fourth pads 150d may correspondingly vertically overlap the plurality of third pads 150c.

Each of the first, second, third, and fourth key patterns 130a, 130b, 130c, and 130d may vertically overlap in the second direction D2 with a corresponding one of the plurality of fourth pads 150d. For example, the first, second, third, and fourth key patterns 130a, 130b, 130c, and 130d may correspondingly vertically overlap in the second direction D2 with the plurality of fourth pads 150d. The fourth upper pattern group UP4 may further include a fourth upper interlayer dielectric layer 117 that is on and/or covers the plurality of fourth pads 150d and the plurality of fourth upper test patterns 164d.

The plurality of pads 150 may include the first, second, third, and fourth pads 150a, 150b, 150c, and 150d. The first, second, third, and fourth pads 150a, 150b, 150c, and 150d may be electrically connected to each other through the vias 170 interposed therebetween. The test patterns 160 may include the first, second, third, and fourth lower test patterns 162a, 162b, 162c, and 162d and the first, second, third, and fourth upper test patterns 164a, 164b, 164c, and 164d. The test patterns 160 may constitute test elements that evaluate characteristics of the semiconductor elements (e.g., transistor, capacitor, resistor, and/or inductor) on the chip regions CR of FIG. 1. A number of the first, second, third, and fourth lower test patterns 162a, 162b, 162c, and 162d and the first, second, third, and fourth upper test patterns 164a, 164b, 164c, and 164d illustrated in FIGS. 3 to 5 is an example, and more or fewer patterns may be included without deviating from the embodiments of the present inventive concepts. In addition, a number of the first, second, third, and fourth dummy patterns 120a, 120b, 120c, and 120d illustrated in FIGS. 3 to 5 is merely an example, and more or fewer patterns may be included without deviating from the embodiments of the present inventive concepts An increase in integration of a semiconductor device may increase the number of key patterns used for photolithography and the number of test elements for evaluation of characteristics of the semiconductor device. A scribe line may have a limited area between chip regions of the semiconductor device, and thus the key patterns and the test patterns may be difficult to form in the limited area of the scribe line.

According to the present inventive concepts, the key patterns 130 used for photolithography may be disposed below the plurality of pads 150 of the test element group TEG. Each of the plurality of key patterns 130 may vertically overlap a corresponding one of the plurality of pads 150. As the plurality of key patterns 130 are disposed to lie below and to vertically overlap the plurality of pads 150, it may be possible to effectively use a limited area of the scribe line SL and thus to easily increase the number of the chip regions CR in the substrate 100. Accordingly, embodiments of the present inventive concepts may make it easier to increase an integration of semiconductor devices.

Moreover, as the plurality of key patterns 130 are disposed to lie below and to vertically overlap the plurality of pads 150, it may be easy to increase the number of the plurality of key patterns 130 formed on the scribe line SL. Accordingly, it may be possible to increase a process margin of photolithography in which the plurality of key patterns 130 are used. As a result, embodiments of the present inventive concepts may make it easier to fabricate semiconductor devices.

Figure 6:
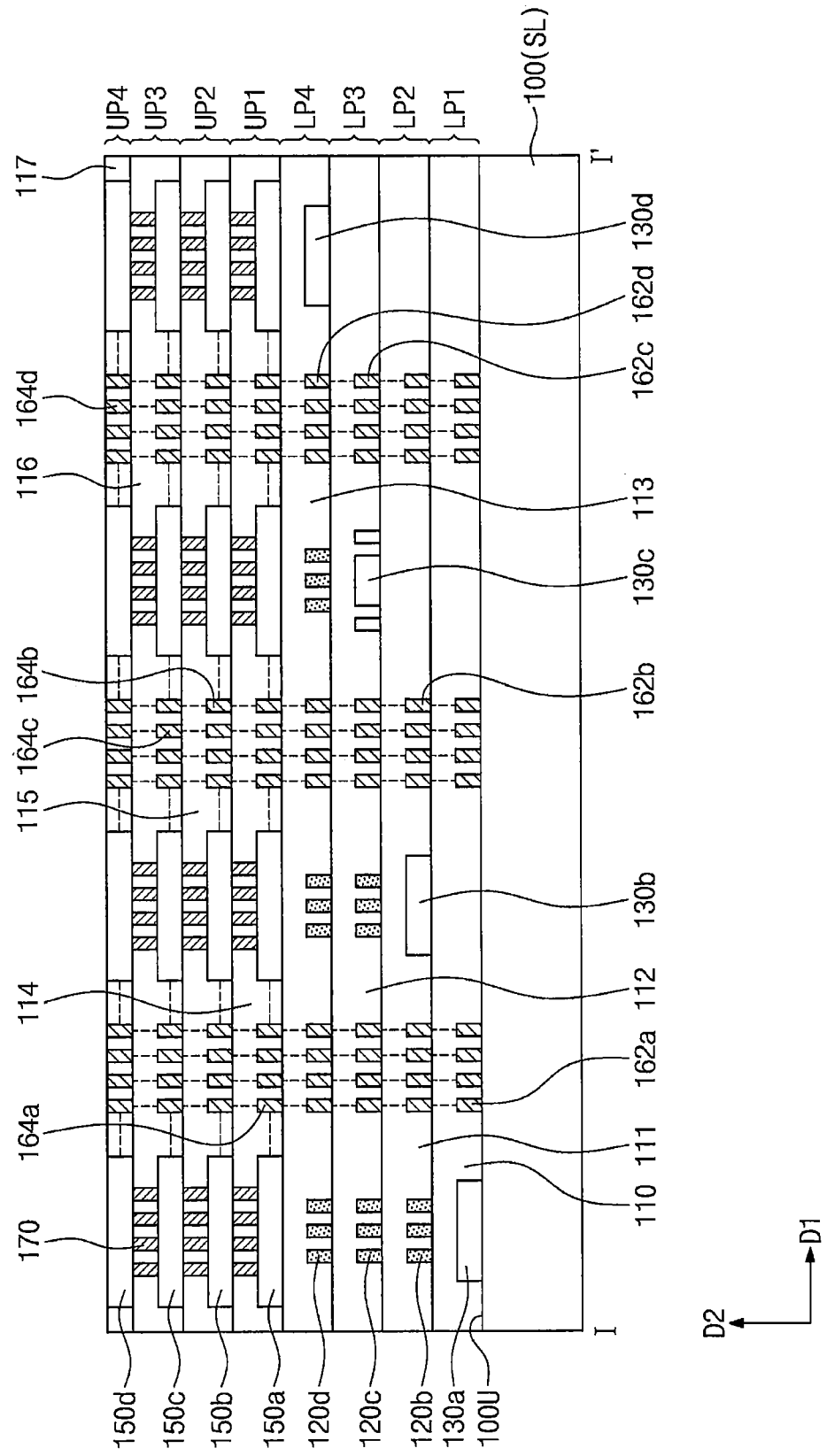
FIG. 6 illustrates a cross-sectional view taken along line I-I' of FIG. 3, showing a semiconductor device according to some example embodiments of the present inventive concepts.
Figure 7:
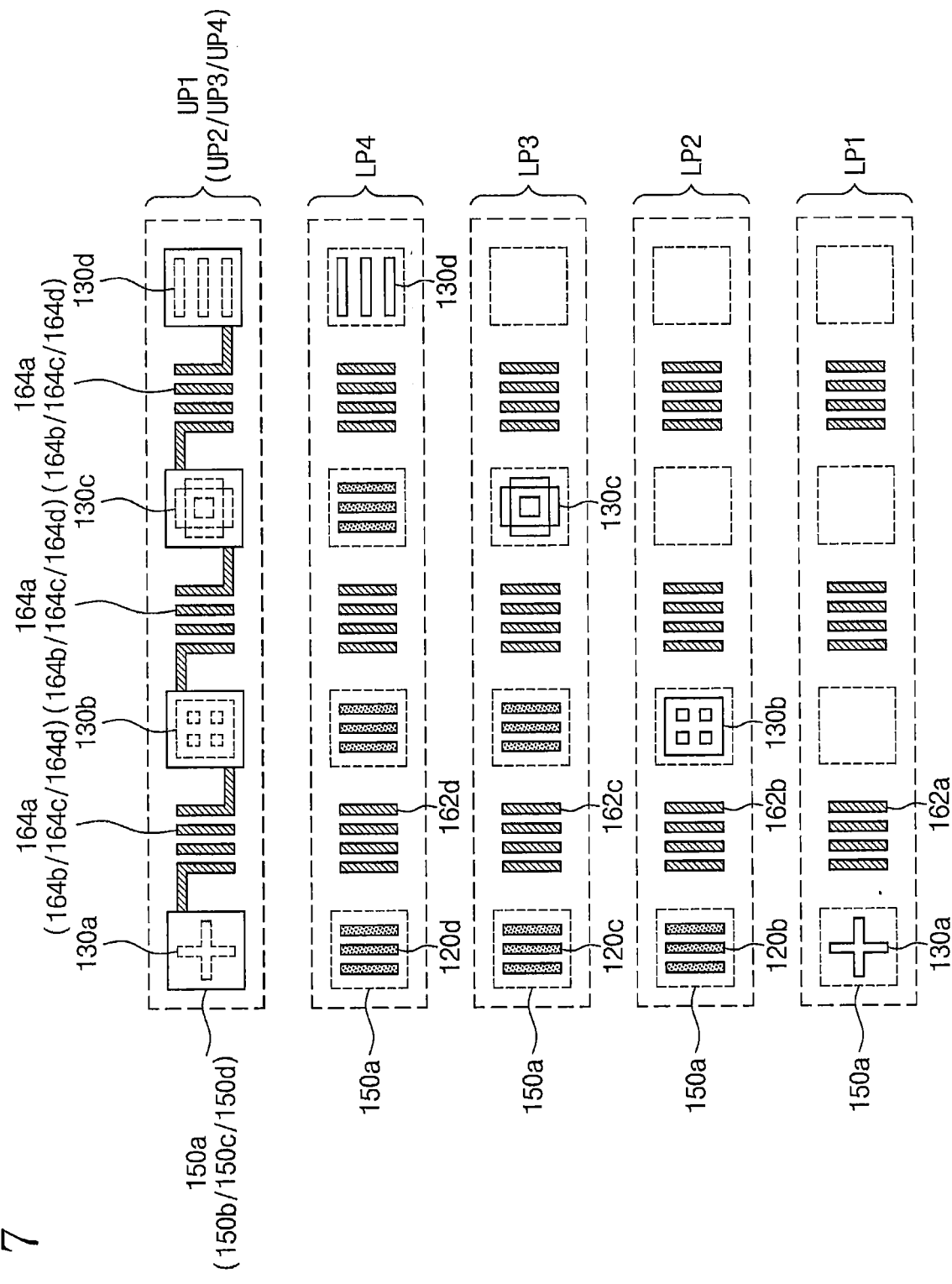
FIG. 7 illustrates a simplified conceptual diagram showing a planar arrangement of patterns in each pattern group of FIG. 6.

FIG. 6 illustrates a cross-sectional view taken along line I-I' of FIG. 3, showing a semiconductor device according to some example embodiments of the present inventive concepts. FIG. 7 illustrates a simplified conceptual diagram showing a planar arrangement of patterns in each pattern group of FIG. 6. The following semiconductor device is similar to that discussed with reference to FIGS. 1 to 5, and thus the major differences between the semiconductor devices will be described below in the interest of brevity of description.

Referring to FIGS. 3, 6, and 7, the first lower pattern group LP1 may include the first key pattern 130a among the plurality of key patterns 130, the first lower test patterns 162a that are horizontally spaced apart from the first key pattern 130a, and the first lower interlayer dielectric layer 110 that is on and/or covers the first key pattern 130a and the first lower test patterns 162a. According to some example embodiments, the first lower pattern group LP1 may include none of the first dummy patterns 120a.

The second lower pattern group LP2 may include the second key pattern 130b among the plurality of key patterns 130. According to some example embodiments, patterns in the first lower pattern group LP1 may not be disposed below (e.g., directly below and/or vertically overlapping) the second key pattern 130b. For example, when viewed in plan, the second key pattern 130b may be spaced apart in the first direction D1 from the first key pattern 130a and the first lower test patterns 162a, and may not vertically overlap in the second direction D2 with other additional patterns (e.g., the first dummy patterns 120a of FIG. 4) in the first lower pattern group LP1.

The second lower pattern group LP2 may include the second lower test patterns 162b that are horizontally spaced apart from the second key pattern 130b, the second dummy patterns 120b that are horizontally spaced apart from the second key pattern 130b and the second lower test patterns 162b, and the second lower interlayer dielectric layer 111 that is on and/or covers the second key pattern 130b, the second lower test patterns 162b, and the second dummy patterns 120b. At least one of the second dummy patterns 120b may vertically overlap in the second direction D2 with the first key pattern 130a.

The third lower pattern group LP3 may include the third key pattern 130c among the plurality of key patterns 130. According to some example embodiments, none of patterns in the first lower pattern group LP1 and in the second lower pattern group LP2 may be disposed below and/or vertically overlapping the third key pattern 130c. For example, when viewed in plan, the third key pattern 130c may be spaced apart in the first direction D1 from the first and second key patterns 130a and 130b, the first and second lower test patterns 162a and 162b, and the second dummy patterns 120b, and may vertically overlap in the second direction D2 with none of patterns in the first lower pattern group LP1 and in the second lower pattern group LP2.

The third lower pattern group LP3 may include the third lower test patterns 162c that are horizontally spaced apart from the third key pattern 130c, the third dummy patterns 120c that are horizontally spaced apart from the third key pattern 130c and the third lower test patterns 162c, and the third lower interlayer dielectric layer 112 that is on and/or covers the third key pattern 130c, the third lower test patterns 162c, and the third dummy patterns 120c. One or more of the third dummy patterns 120c may vertically overlap in the second direction D2 with the first key pattern 130a, and another one or more of the third dummy patterns 120c may vertically overlap in the second direction D2 with the second key pattern 130b.

The fourth lower pattern group LP4 may include the fourth key pattern 130d among the plurality of key patterns 130. According to some example embodiments, none of patterns in the first lower pattern group LP1, in the second lower pattern group LP2, and in the third lower pattern group LP3 may be disposed below and/or vertically overlapping the fourth key pattern 130d. For example, when viewed in plan, the fourth key pattern 130d may be spaced apart in the first direction D1 from the first, second, and third key patterns 130a, 130b, and 130c, the first, second, and third lower test patterns 162a, 162b, and 162c, and the second and third dummy patterns 120b and 120c, and may vertically overlap in the second direction D2 with none of patterns in the first lower pattern group LP1, in the second lower pattern group LP2, and in the third lower pattern group LP3.

The fourth lower pattern group LP4 may include the fourth lower test patterns 162d that are horizontally spaced apart from the fourth key pattern 130d, the fourth dummy patterns 120d that are horizontally spaced apart from the fourth key pattern 130d and the fourth lower test patterns 162d, and the fourth lower interlayer dielectric layer 113 that is on and/or covers the fourth key pattern 130d, the fourth lower test patterns 162d, and the fourth dummy patterns 120d. One or more of the fourth dummy patterns 120d may vertically overlap in the second direction D2 with the first key pattern 130a, and another one or more of the fourth dummy patterns 120d may vertically overlap in the second direction D2 with the second key pattern 130b. Still another one or more of the fourth dummy patterns 120d may vertically overlap in the second direction D2 with the third key pattern 130c.

The first, second, third, and fourth upper pattern groups UP1, UP2, UP3, and UP4 may be substantially the same as the first, second, third, and fourth upper pattern groups UP1, UP2, UP3, and UP4 that are discussed with reference to FIGS. 3 to 5.

According to some example embodiments, each of the first, second, third, and fourth key patterns 130a, 130b, 130c, and 130d may vertically overlap none of patterns disposed thereunder. The first, second, third, and fourth key patterns 130a, 130b, 130c, and 130d may thus be easily discriminated during photolithography. As a result, semiconductor devices may be more easily fabricated.

Figure 8:
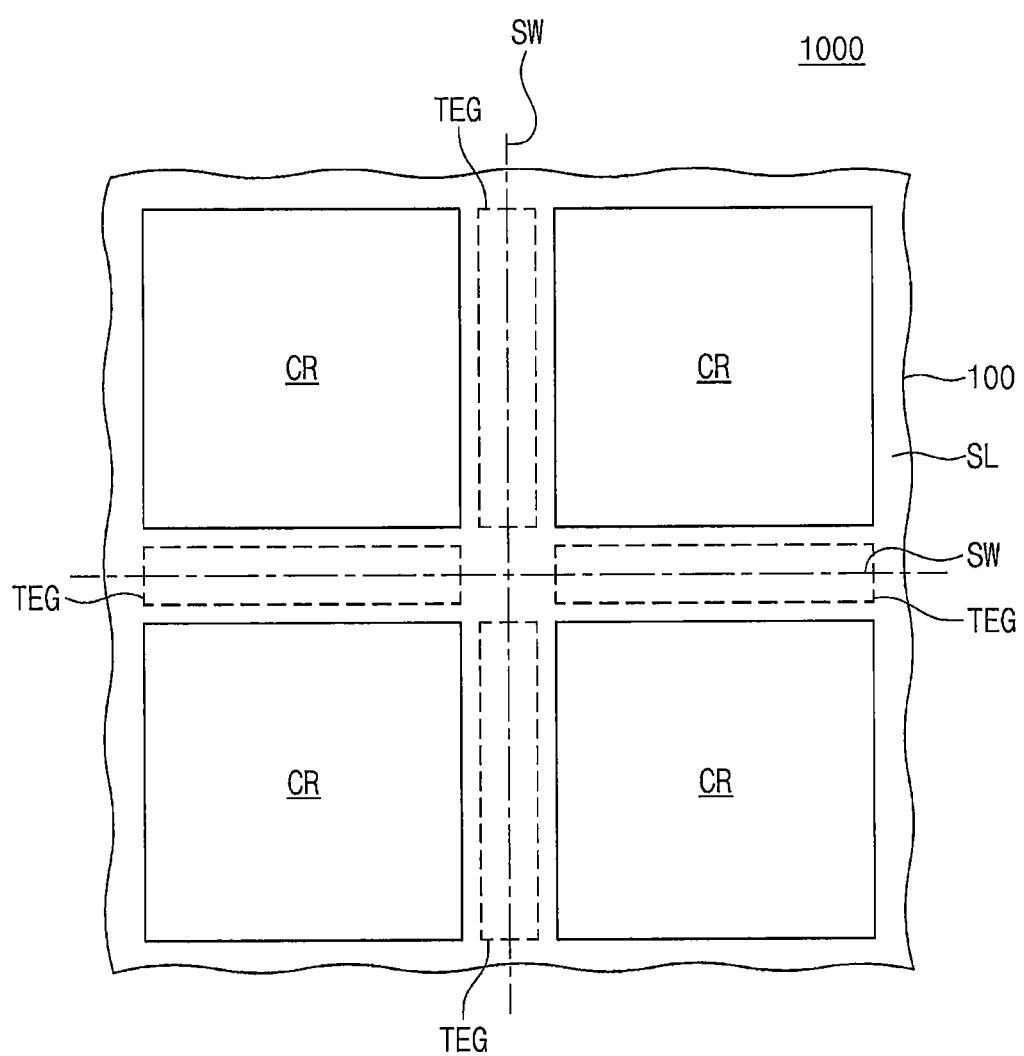
FIG. 8 illustrates a plan view showing a semiconductor device on which is depicted a sawing line for separation of chip regions.

FIG. 8 illustrates a plan view showing a semiconductor device 1000 on which is depicted a sawing line for separation of chip regions.

Referring to FIG. 8, the plurality of chip regions CR may be cut along a sawing line SW on the scribe line SL, thereby being separated into a plurality of semiconductor chips. According to some example embodiments, at least one of the plurality of semiconductor chips may include the test element group TEG discussed with reference to FIGS. 2 to 7. In this case, the test element group TEG in the at least one of the plurality of semiconductor chips may be electrically floated.

According to the present inventive concepts, a plurality of key patterns used for photolithography may be disposed below a plurality of pads in a test element group (TEG), and may vertically overlap the plurality of pads. A limited area of a scribe line may thus be effectively used in a semiconductor substrate, and accordingly it may be easier to increase the number of chip regions in the semiconductor substrate. As a result, embodiments of the present inventive concepts may make it easier to increase an integration of semiconductor devices.

Furthermore, as the plurality of key patterns are disposed to lie below and to vertically overlap the plurality of pads, it may be easier to increase the number of the plurality of key patterns formed on the scribe line. It may thus be possible to increase a process margin of photolithography in which the plurality of key patterns are used. As a result, semiconductor devices may be more easily fabricated.

The aforementioned description provides some example embodiments for explaining the present inventive concepts. Therefore, the present inventive concepts are not limited to the embodiments described above, and it will be understood by one of ordinary skill in the art that variations in form and detail may be made therein without departing from the scope of the present inventive concepts.

What is claimed is:
1. A semiconductor device, comprising:
a substrate;

a first lower pattern group on the substrate, wherein the first lower pattern group comprises a first key pattern and a plurality of first lower test patterns that are horizontally spaced apart from the first key pattern; and a first upper pattern group on the first lower pattern group, wherein the first upper pattern group comprises a plurality of first pads that are horizontally spaced apart from each other and a plurality of first upper test patterns between adjacent ones of the plurality of first pads, wherein the first key pattern is configured to be used for a photography process associated with fabrication of the semiconductor device, wherein the plurality of first pads are electrically connected to the plurality of first upper test patterns, and wherein one of the plurality of first pads vertically overlaps with the first key pattern.

2. The semiconductor device of claim 1, wherein the plurality of first lower test patterns, the plurality of first upper test patterns, and the plurality of first pads constitute a test element group (TEG) that is configured to evaluate characteristics of semiconductor elements of the semiconductor device.

3. The semiconductor device of claim 1, wherein the plurality of first lower test patterns are electrically connected to the plurality of first upper test patterns.

4. The semiconductor device of claim 1, wherein the first key pattern comprises an alignment key and/or an overlay key used for photolithography.

5. The semiconductor device of claim 1, further comprising a second lower pattern group between the first lower pattern group and the first upper pattern group, wherein the second lower pattern group comprises:
a second key pattern; and
a plurality of second lower test patterns that are horizontally spaced apart from the second key pattern, wherein the second key pattern is configured to be used for the photography process associated with the fabrication of the semiconductor device, and wherein another of the plurality of first pads vertically overlaps the second key pattern.

6. The semiconductor device of claim 5, wherein the plurality of first lower test patterns, the plurality of second lower test patterns, the plurality of first upper test patterns, and the plurality of first pads constitute a test element group (TEG) that is configured to evaluate characteristics of semiconductor elements of the semiconductor device.

7. The semiconductor device of claim 5, wherein the plurality of first lower test patterns and the plurality of second lower test patterns are electrically connected to the plurality of first upper test patterns.

8. The semiconductor device of claim 5, wherein each of the first and second key patterns is an alignment key and/or an overlay key used for photolithography.

9. The semiconductor device of claim 5, wherein the second lower pattern group further comprises a plurality of dummy patterns that are horizontally spaced apart from the second key pattern and the plurality of second lower test patterns, and wherein the plurality of dummy patterns are between the first key pattern and the one of the plurality of first pads.

10. The semiconductor device of claim 9, wherein the one of the plurality of first pads vertically overlaps the plurality of dummy patterns and the first key pattern.

11. The semiconductor device of claim 1, further comprising a second upper pattern group on the first upper pattern group, wherein the second upper pattern group comprises:
a plurality of second pads that are horizontally spaced apart from each other; and
a plurality of second upper test patterns between adjacent ones of the plurality of second pads, wherein the plurality of second pads are electrically connected to the plurality of second upper test patterns, and wherein one of the plurality of second pads vertically overlaps the first key pattern.

12. The semiconductor device of claim 11, wherein the one of the plurality of second pads vertically overlaps the one of the plurality of first pads.

13. The semiconductor device of claim 12, further comprising a plurality of vias between the one of the plurality of first pads and the one of the plurality of second pads, wherein the one of the plurality of second pads is electrically connected through the plurality of vias to the one of the plurality of first pads.

14. A semiconductor device, comprising:
a substrate that comprises a plurality of chip regions and a scribe line between the plurality of chip regions;
a plurality of key patterns on the scribe line; and
a test element group (TEG) on the scribe line, wherein the test element group comprises a plurality of pads that are spaced apart from each other in a first direction parallel to a top surface of the substrate, wherein the plurality of key patterns are between the substrate and the plurality of pads, wherein each of the plurality of key patterns vertically overlaps in a second direction with a corresponding one of the plurality of pads, the second direction being perpendicular to the top surface of the substrate, and wherein the plurality of key patterns are at different levels in the second direction from the top surface of the substrate.

15. The semiconductor device of claim 14, wherein the plurality of pads are at a same level in the second direction from the top surface of the substrate.

16. The semiconductor device of claim 15, wherein the plurality of key patterns comprises a first key pattern and a second key pattern, wherein the second key pattern is at a second level higher than a first level of the first key pattern, the first and second levels being measured in the second direction from the top surface of the substrate, wherein a first pad of the plurality of pads vertically overlaps in the second direction with the first key pattern, and wherein a second pad of the plurality of pads vertically overlaps in the second direction with the second key pattern.

17. The semiconductor device of claim 16, further comprising a plurality of dummy patterns between the first key pattern and the first pad.

18. The semiconductor device of claim 17, wherein at least one of the plurality of dummy patterns is at the second level of the second key pattern, as measured in the second direction from the top surface of the substrate.

19. The semiconductor device of claim 14, wherein each of the plurality of key patterns is an alignment key and/or an overlay key used for photolithography.

20. A semiconductor device, comprising:
a substrate comprising a plurality of chip regions and a scribe line between the plurality of chip regions;
a lower pattern group on the scribe line, wherein the lower pattern group comprises a photolithography key pattern and a plurality of lower test patterns that are horizontally spaced apart from the photolithography key pattern; and an upper pattern group on the lower pattern group, wherein the upper pattern group comprises a first pad and a plurality of upper test patterns that are horizontally spaced apart from the first pad, wherein the first pad is electrically connected to the plurality of upper test patterns and the plurality of lower test patterns, and wherein the first pad vertically overlaps the photolithography key pattern.

* * * * *